(12) United States Patent
Beaujuge et al.

(10) Patent No.: US 8,519,088 B2
(45) Date of Patent: Aug. 27, 2013

(54) EARTH-TONED PHOTOVOLTAIC DEVICES

(75) Inventors: Pierre Marc Beaujuge, Jeddah (SA); John R. Reynolds, Dunwoody, GA (US); Franky So, Gainesville, FL (US); Jegadesan Subbiah, Brunswick (AU)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 13/321,875

(22) PCT Filed: May 26, 2010

(86) PCT No.: PCT/US2010/036167
§ 371 (c)(1),
(2), (4) Date: Nov. 22, 2011

(87) PCT Pub. No.: WO2011/005370
PCT Pub. Date: Jan. 13, 2011

(65) Prior Publication Data
US 2012/0067395 A1  Mar. 22, 2012

Related U.S. Application Data

(60) Provisional application No. 61/181,131, filed on May 26, 2009.

(51) Int. Cl.
*C08G 75/00* (2006.01)
(52) U.S. Cl.
USPC ............ 528/377; 528/380; 136/244; 977/948

(58) Field of Classification Search
CPC ...................................................... C08G 75/00
USPC ................. 528/377, 380; 136/244; 977/948
See application file for complete search history.

(56) References Cited

U.S. PATENT DOCUMENTS

| 2006/0130895 A1 | 6/2006 | Gaudiana et al. |
| 2007/0073052 A1 | 3/2007 | Velusamy et al. |
| 2011/0251370 A1* | 10/2011 | Beaujuge et al. ................ 528/9 |

FOREIGN PATENT DOCUMENTS

| WO | WO 2009/058877 A1 | 5/2009 |
| WO | WO 2009/070706 A2 | 6/2009 |
| WO | WO 2010/062948 A2 | 6/2010 |
| WO | WO 2010/138566 A2 | 12/2010 |

OTHER PUBLICATIONS

Liao et al. Macromolecules 2007, 40, 9406-9412.*
Zhu et al. Macromolecules 2007, 40, 1981-1986.*
Zhang et al. Adv. Mater. 2006, 18, 2169-2173.*
Lee et al. Macromol. Chem. Phys. 2007, 208, 1919-1927.*
Pisula et al. J. Am. Chem. Soc. 2009, 131, 7514-7515.*

* cited by examiner

*Primary Examiner* — Shane Fang
(74) *Attorney, Agent, or Firm* — Saliwanchik, Lloyd & Eisenschenk

(57) ABSTRACT

The invention is directed to an assembly of photovoltaic cells having at least two different earth-toned colors, where different colors are situated in different cells, the cells color being defined by the donor-acceptor (DA) π-conjugated polymer and an acceptor moiety combination comprising the photoactive layer of the cell, and where the different colored solar cells are coupled into an assembly. The assembly can be flexible and can have colors specifically arranged in a camouflage or other pattern.

6 Claims, 4 Drawing Sheets

EARTH-TONED PHOTOVOLTAIC DEVICES

CROSS-REFERENCE TO RELATED APPLICATIONS

This application is the U.S. national stage application of International Patent Application No. PCT/US2010/036167, filed May 26, 2010, which claims the benefit of U.S. Provisional Application Ser. No. 61/181,131, filed May 26, 2009, the disclosures of which are hereby incorporated by reference in their entireties, including any figures, tables, or drawings.

GOVERNMENT SUPPORT

The subject invention was made with government support under a research project supported by Air Force Office of Scientific Research, Contract No. UF Project 59866. The government has certain rights to this invention.

BACKGROUND OF INVENTION

Organic solar cells and polymer solar cells are built from thin films of organic semiconductors such as polymers and small-molecule compounds. Although energy conversion efficiencies achieved to date using conductive polymers are low compared to inorganic materials, such cells are beneficial for applications where mechanical flexibility or weight are required or desired. Furthermore, polymeric solar cells are generally lower in cost to manufacture than solar cell of polysilicon or other alternate designs.

Recently, there has been a drive to integrate solar cell technology into architecture, automobiles, and portable devices including clothing. Many designers for such applications are increasingly looking to flexible photovoltaic devices. One goal in this direction is that the desired appearance of the article define the appearance of the photovoltaic device, rather that the appearance of the photovoltaic device dictating the appearance of the article.

A typical solar cell or other photovoltaic device is often either blue-black or reddish-brown in color. To achieve other colored cell, a transparent colored layer, for example a pigmented anti-reflective coating, can be placed over the device. In other cases, a colored layer is placed over non-energy generating portions of the device. Recently, dye-sensitized cells using different colored dyes have been used to form cells with various desired colors. Recently camouflage solar panels have been formed in this manner. However, polymeric solar cells, where the device's color results from the inherent color of the polymer, have not been used to form photovoltaic devices with a pattern of colors, such as camouflage. Where specific colors are available, it is desirable to tune the color or intensity systematically such that the color can match that desired for a given segment of the article covered with the photovoltaic device.

BRIEF SUMMARY

Embodiments of the invention are directed to an assembly of photovoltaic cells of different earth-toned colors where a plurality of solar cells, displaying a plurality of colors, is coupled into a solar cell assembly. Individual solar cells derive their color and photoactivity from a donor-acceptor (DA) π-conjugated polymer acceptor moiety combination. Assemblies of different colors and color intensities allow the construction of light harvesting devices that can have camouflage or other color patterns where the desired appearance of the appliance's surface defines the colors and distribution of the solar cells.

The DA π-conjugated polymers can display a green color or a black color when isolated from an acceptor moiety and have space-charge limited (SCL) zero field hole mobilities of at least $1\times10^{-6}$ cm$^2$ V$^{-1}$s$^{-1}$. Two useful DA π-conjugated polymers are PMB-250 (green) and PMB-282 (black) which have the structures:

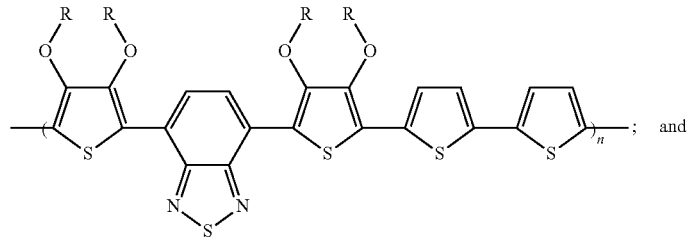

PMB-250

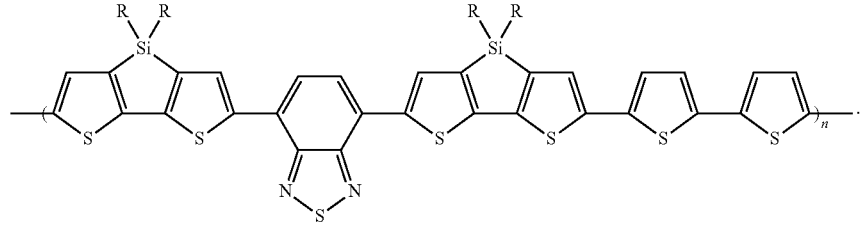

PMB-282

The acceptor moieties can be substituted buckminsterfullerenes or inorganic metal oxides, which will augment the colors inherent to the DA π-conjugated polymers. Substituted buckminsterfullerenes can be [6,6]-phenyl-C$_{61}$-butyric acid methyl ester (PC$_{60}$BM) or [6,6]-phenyl-C$_{71}$-butyric acid methyl ester (PC$_{70}$BM).

The solar cells can be constructed on polymer substrates, which can be combined into an assembly that is mechanically flexible.

DETAILED DISCLOSURE

Figure 1:
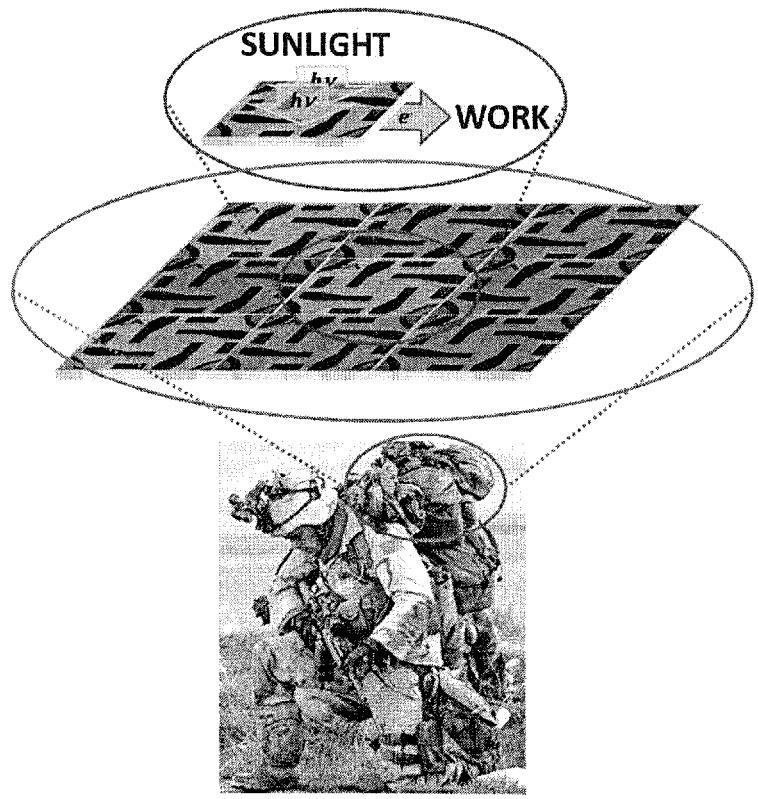
FIG. 1 shows an earth toned assembly of green-, brown- and grey/black-colored solar cells according to an embodiment of the invention and a photograph of exemplary military gears and fabrics.
Figure 2:
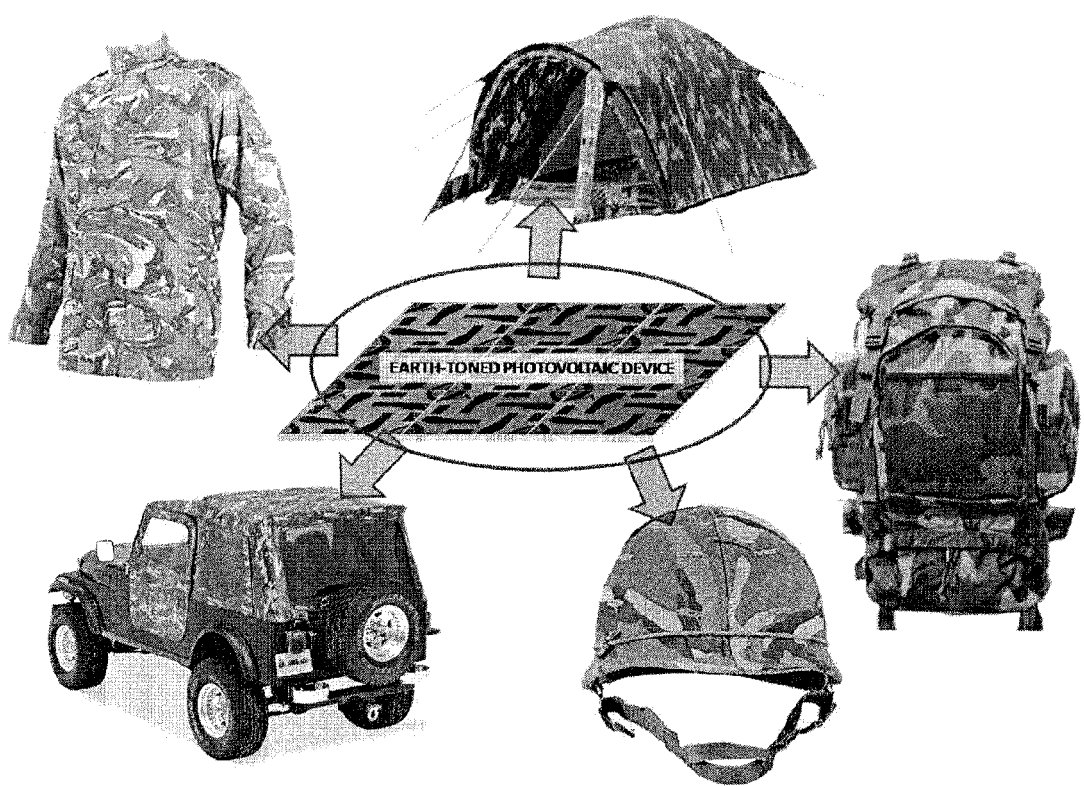
FIG. 2 are photographs of representative applications for an earth-toned photovoltaic device include clothing, tents, bags, helmets, motorized vehicles, and other camouflage-related applications that can be covered with the camouflage solar cell assembly according to embodiments of the invention.

An embodiment of the invention is directed to combining green-, brown- and grey/black-colored solar cells into an assembled earth-toned and lightweight photovoltaic device, as illustrated in FIG. 1, which is flexible, if needed, and can be incorporated in military gears, chameleonic fabrics, and other camouflage-related applications, as illustrated in FIG. 2. Solar cells with this physical appearance can be employed by military units where the minimization of conventional battery use is desired.

The earth-toned photovoltaic device is made of an assembly of individually constructed solar cells employing molecular chromophores that exhibit an earth-toned color such as green, brown, or grey/black, in a desired pattern, as illustrated in FIG. 1. The earth-toned colors arise from the structure of the molecular chromophores, which comprise donor-acceptor (DA) π-conjugated polymers combined with acceptor moieties and are the photoactive layer of the solar cell. In this manner, no layer that absorbs photons is required to be placed on the solar cell to achieve a desired color. The device is an assembly of individually constructed solar cells to yield a larger area device. Each chromophore is processed using an optimized protocol that can differ for each molecular system of a specific conjugated polymer and acceptor moiety such that each mono-colored light-harvesting "pixel" can achieve optimized photovoltaic performance before incorporation into the light-harvesting pattern. In an embodiment of the invention, solar cells of dye sensitized construction can be included within the pixels of conductive polymer construction. The solar cells can be constructed on plastic substrates to form arrays that are mechanically flexible. For example a transparent conducting oxide (TCO)-coated plastic substrate with a coating of the photoactive DA π-conjugated polymer can be used to construct individual flexible solar cells, where the individual cells can be connected into an array. The construction of the solar cell array allows easy replacement of a defective, aged or damaged cell without the need to discard the entire article. In addition to military camouflage, other aesthetically pleasing patterns can be produced from the various combinations of earth-toned light-harvesting "pixels" that closely mimic the patterns of natural trees, bushes or plants. For example, a wall can display a solar cell mural that appears to be a forest, desert, seashore, mountainside or any landscape. Solar cell murals need not be natural in appearance where the solar cell mural can constitute modern public (or private) art as well as a power source.

The conjugated polymers used for the construction of the different light harvesting pixels are those that have substantial charge-carrier mobilities. Donor-acceptor (DA) π-conjugated polymers have been realized for this purpose, where the polymers reflect a green color that can display blue or yellow tints and have solubility due to a $D1_k AD1_k$ portion of the repeating unit where D1 is an electron rich donor unit that has solubilizing side groups, k is one or two, and A is an acceptor unit. The DA π-conjugated polymers possess high charge-carrier mobilities because of a spacer sequence of donor units, $D2_m$, where m is 1 to 6, and the donor units are conjugated units fixed in, or can assume, a conformation where all atoms of the donor unit can reside in a single plane. These green DA π-conjugated polymers possess a space-charge limited (SCL) zero field hole mobility of at least $1 \times 10^{-6}$ cm$^2$ V$^{-1}$s$^{-1}$. The nature of the $D1_k AD1_k$ is analogous to that disclosed for electrochromic polymers in Beaujuge et al., International Application No. PCT/US2008/081599, filed Oct. 29, 2008, entitled "Green to Transmissive Soluble Electrochromic Polymers", and is incorporated herein by reference. The $(D1_k AD1_k D2_m)_n$ polymers that can be used are disclosed in Beaujuge et al., U.S. Provisional Patent Application, Ser. No. 61/181,058, filed May 26, 2009, entitled "Green Soluble Conjugated Polymers with High Charge Carrier Mobilities" which is incorporated herein by reference.

Other DA π-conjugated polymers are used for the black or gray portions of the combination solar cells according to embodiments of the invention which also exhibit substantial charge-carrier mobilities in solar cells and other solid state devices. The preparation of these black soluble conjugated polymers is disclosed in Beaujuge et al., International Application No. PCT/US2009/065903, filed Nov. 25, 2009, entitled "Black Soluble Conjugated Polymers with High Charge Carrier Mobilities", and is incorporated herein by reference.

In an embodiment of the invention, where a specific green polymer donor:

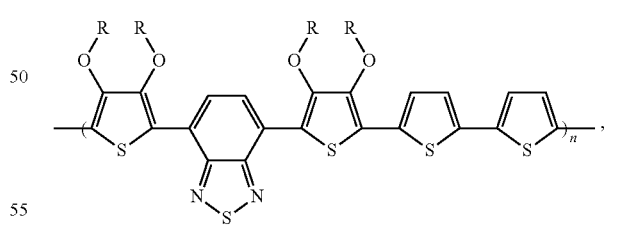

Figure 3:
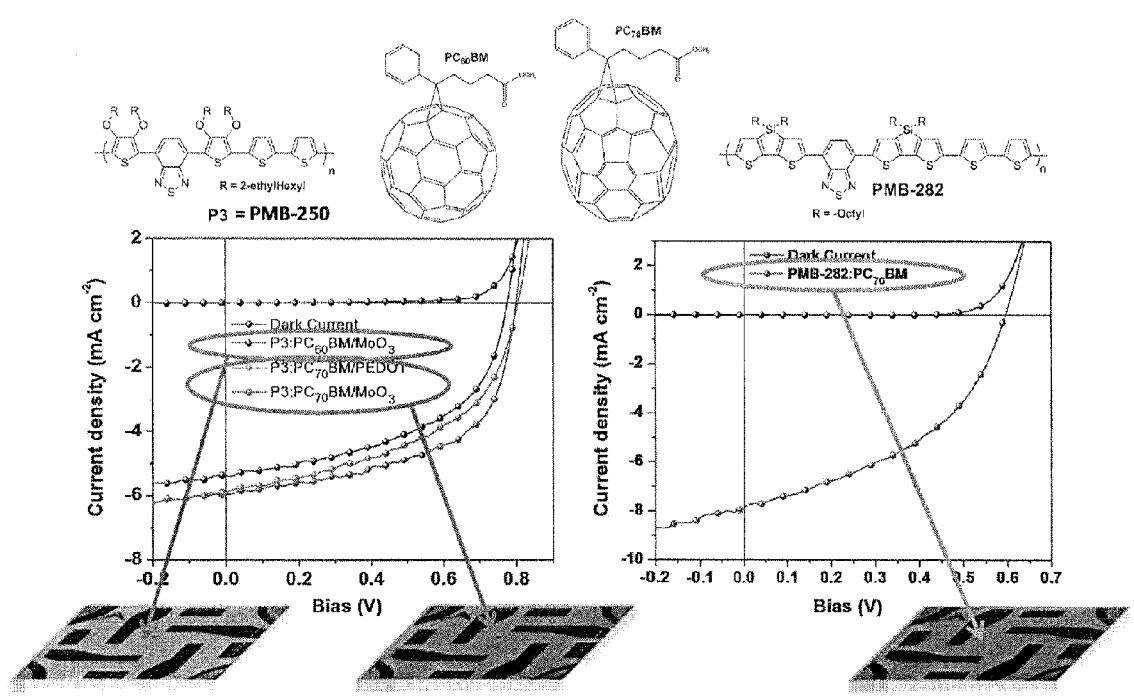
FIG. 3 is a schematic indicating mono-colored light-harvesting "pixels" arising from a combination of indicated photoactive constituents according to an embodiment of the invention.

PMB-250 is mixed with an acceptor, [6,6]-phenyl-$C_{61}$-butyric acid methyl ester (PC$_{60}$BM), a green solar cell results because the optical absorption of PC$_{60}$BM is located primarily in the UV region of the spectrum, as illustrated in FIG. 3. When PMB-250 is mixed with [6,6]-phenyl-$C_{71}$-butyric acid methyl ester (PC$_{70}$BM), the resulting blend and device becomes brown as shown in FIG. 3, owing to the peak absorption of PC$_{70}$BM at ca. 450 nm and tails to wavelengths as high as 650 nm, filling the transmission window of the green polymer from about 480 to about 550 nm.

In an embodiment of the invention, blends of a black polymer:

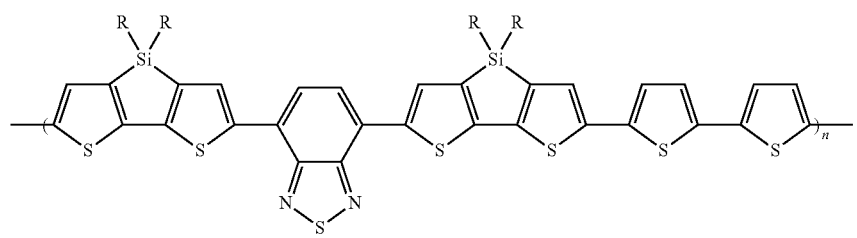

PMB-282 with either $PC_{60}BM$ or $PC_{70}BM$ results in a grey to black solar cell device as shown in FIG. 3 as a function, in part, of the thickness of the active layer that is formed. The DA π-conjugated polymer and PCBM can be deposited from solution or suspension to form the active layer.

Figure 4:
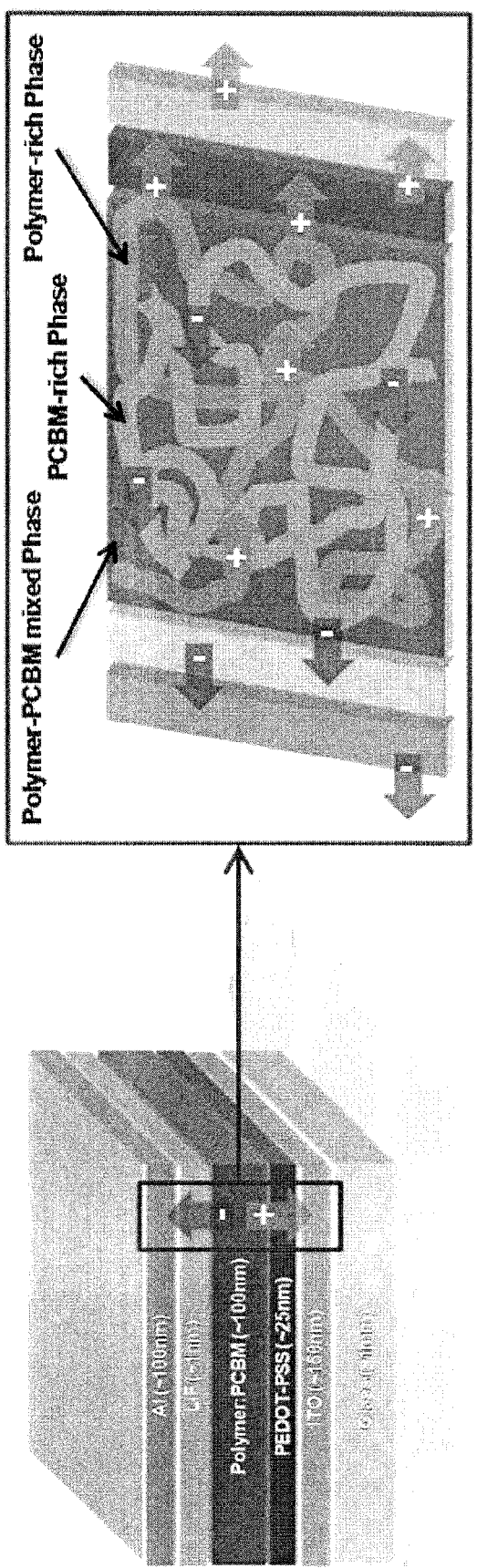
FIG. 4 shows a solar cell layered structure according to an embodiment of the invention and a schematic of a stylized component mixture of the photoactive layer according to an embodiment of the invention.

According to an embodiment of the invention, an individual solar cell can be constructed as illustrated in FIG. 4. The illustrated solar cell has limited flexibility as it includes a 1 mm glass substrate covered with a 150 nm indium-tin-oxide (ITO) conductive glass layer and 25 nm poly(3,4-ethylenedioxythiophene):Poly(styrenesulfonate) (PEDOT:PSS) hole-transport interface layer that constitutes a transparent electrode. The DA π-conjugated polymer and acceptor moiety deposited at 100 nm in thickness contacts a 1 nm LiF interfacial layer that connects to a 100 nm aluminum counter electrode. In other embodiments of the invention, the substrates, electrodes and interfacial layers, and the thickness of all layers can be varied to achieve desired electrical and aesthetic characteristics. In other embodiments of the invention, a plastic substrate, such as poly(ethylene terephthalate) (PET) or other polymers having or coated to have a very low oxygen and moisture permeability can be used rather than glass as a substrate to permit fabrication of a flexible cell. In some embodiments of the invention, ITO can be substituted with other transparent conductors, such as an ultrathin metal film, for example a gold film, or a transparent carbon nanotube film. Other conducting polymer films can be used rather than the PEDOT:PSS film of FIG. 4. The color, tone and intensity displayed by the cell can be varied depending on the thickness, the structure of the DA π-conjugated polymer, the structure of the acceptor moiety, and the proportions of the polymer and acceptor moiety.

The photovoltaic properties of PMB-250 was investigated in donor-acceptor bulk heterojunction (BHJ) solar cells with $PC_{60}BM$ or $PC_{70}BM$ as the acceptor, using simulated AM 1.5 G solar illumination at an irradiation intensity of 100 mW $cm^{-2}$. The composition of the PMB-250:$PC_{60}BM$ blends was optimized for devices as indicated in FIG. 4 where the blends were spin-cast from chlorobenzene onto ~30 nm PEDOT:PSS coated ITO or a 5 nm $MoO_3$ coated ITO. The photovoltaic properties are summarized in Table 1, below, for different blends for these green solar cells using PEDOT:PSS coated ITO. In like manner PMB-250:$PC_{70}BM$ blends were examined as indicated in Table 2, below, where $PC_{60}BM$ and $PC_{70}BM$ were employed as acceptors in combination with PEDOT:PSS or $MoO_3$ as the hole-transporting interface layer. The solar cell devices containing $PC_{70}BM$ were brown in color.

TABLE 1

Solar cell device performance for PMB-250:$PC_{60}BM$ as a function of blend composition for an ITO/PEDOT:PSS/PMB-250:$PC_{60}BM$/LiF/Al device.

| PMB-250:$PC_{60}BM$ (w/w) | $J_{sc}$ (mA cm$^{-2}$) | $V_{oc}$ (V) | FF (%) | PCE (%) |
|---|---|---|---|---|
| 1:4 | 1.99 | 0.78 | 41 | 0.64 |
| 1:6 | 3.93 | 0.77 | 46 | 1.39 |
| 1:7 | 4.79 | 0.76 | 46 | 1.68 |
| 1:8 | 5.56 | 0.77 | 44 | 1.90 |
| 1:9 | 3.97 | 0.73 | 35 | 1.00 |
| 1:10 | 2.10 | 0.71 | 40 | 0.60 |

TABLE 2

Optimized solar cell performance for PMB-250:PCBM for various hole-transporting interface layer (PEDOT:PSS or $MoO_3$) and PCBM type.

| Interface layer/PCBM | $J_{sc}$ (mA cm$^{-2}$) | $V_{oc}$ (V) | FF (%) | PCE (%) |
|---|---|---|---|---|
| PEDOT/$PC_{60}BM$ | 5.56 | 0.77 | 44 | 1.90 |
| $MoO_3$/$PC_{60}BM$ | 5.38 | 0.77 | 51 | 2.12 |
| PEDOT/$PC_{70}BM$ | 5.90 | 0.80 | 48 | 2.31 |
| $MoO_3$/$PC_{70}BM$ | 5.96 | 0.80 | 57 | 2.71 |

The electrodes of the solar cell in FIG. 4 are connected to the external circuit. Assemblies of solar cells can be connected in series and/or parallel to achieve a desired voltage and current to charge a battery or directly power an electrical device. The solar cells can be formed by screen printing or other printing techniques of the DA π-conjugated polymer acceptor moiety of different colors to generate the camouflage patterns; weaving different colored solar cell stripes and connecting the stripes to obtain high operating voltages; or tiling different colored solar cell tiles to create the camouflage patterns, where a backplane provides interconnection between the solar cells.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

The invention claimed is:

1. An assembly of photovoltaic cells, comprising a plurality of solar cells displaying a plurality of different earth-toned colors, wherein each of said solar cells comprises a donor-acceptor (DA) π-conjugated polymer and an acceptor moiety, wherein said earth-toned color arises from structures and proportions of said (DA) π-conjugated polymer and said acceptor moiety, wherein said plurality of different earth-toned colored solar cells are coupled into an assembly, wherein at least one of said plurality of earth-toned colored solar cells has a structurally different composition of said DA π-conjugated polymer and/or acceptor moiety than others of said plurality of earth-toned colored solar cells in said assembly, and wherein at least one of said solar cells comprises:

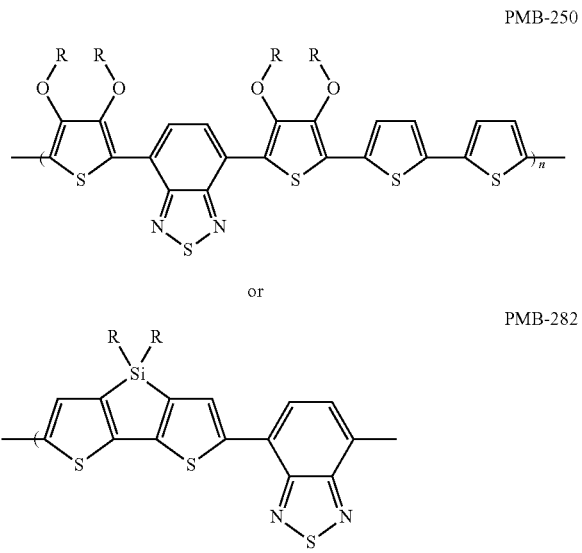

wherein R is ethylhexyl in PMB-250 and octyl in PMB-282 and n is the number of repeating units.

2. The assembly of claim 1, wherein at least one of said DA π-conjugated polymers displays a green color and at least one of said DA π-conjugated polymers displays a black color when isolated from said acceptor moiety and wherein each of said DA π-conjugated polymers has a space-charge limited (SCL) zero field hole mobility of at least $1\times10^{-6} cm^2 V^{-1} S^{-1}$.

3. The assembly of claim 1, wherein said acceptor moiety comprises a substituted buckminsterfullerene or an inorganic metal oxide.

4. The assembly of claim 3, wherein said substituted buckminsterfullerene consists of [6,6]-phenyl-$C_{61}$-butyric acid methyl ester ($PC_{60}BM$) or [6,6]-phenyl-$C_{71}$-butyric acid methyl ester ($PC_{70}BM$).

5. The assembly of claim 1, wherein said solar cells further comprise a polymer substrate and wherein said assembly is mechanically flexible.

6. The assembly of claim 1, wherein said DA π-conjugated polymer comprises $(D1_k AD1_k D2_m)_n$, where D1 is an electron rich donor unit with solubilizing side groups, k is one or two, A is an acceptor unit, D2 is a second donor unit, m is 1 to 6, and n is 5 to 10,000.

* * * * *

UNITED STATES PATENT AND TRADEMARK OFFICE
CERTIFICATE OF CORRECTION

PATENT NO. : 8,519,088 B2  
APPLICATION NO. : 13/321875  
DATED : August 27, 2013  
INVENTOR(S) : Pierre Marc Beaujuge et al.

Page 1 of 1

It is certified that error appears in the above-identified patent and that said Letters Patent is hereby corrected as shown below:

In the Specifications

Column 1,  
Line 17, "Contract No. UF Project 58966" should read --Contract No. FA9550-06-1-0192--.  
Line 65, "colored cell" should read --colored cells--.

Column 5,  
Line 52, "PMB-250 was investigated" should read --PMB-250 were investigated--.

Signed and Sealed this  
Seventeenth Day of December, 2013

Margaret A. Focarino  
*Commissioner for Patents of the United States Patent and Trademark Office*